United States Patent [19]

Takagi et al.

[11] 4,210,473
[45] Jul. 1, 1980

[54] PROCESS FOR PRODUCING A SEMICONDUCTOR DEVICE

[75] Inventors: Mikio Takagi, Kawasaki; Hajime Kamioka, Yokohama; Haruo Shimoda, Tokyo; Hidekazu Miyamoto, Machida, all of Japan

[73] Assignee: Fujitsu Limited, Japan

[21] Appl. No.: 955,754

[22] Filed: Oct. 30, 1978

[30] Foreign Application Priority Data

Nov. 29, 1977 [JP] Japan .................... 52-143189

[51] Int. Cl.² ........................................ H01L 21/223
[52] U.S. Cl. ...................... 148/189; 29/571; 148/187; 148/188
[58] Field of Search ............ 148/189, 187, 188; 29/571

[56] References Cited

U.S. PATENT DOCUMENTS

| | | | |
|---|---|---|---|
| 3,615,873 | 10/1971 | Sluss et al. | 148/1.5 |
| 3,658,606 | 4/1972 | Lyons et al. | 148/187 |
| 3,699,646 | 10/1972 | Vadasz | 29/571 |
| 3,852,128 | 12/1974 | Kreuzer | 148/189 |
| 3,883,372 | 5/1975 | Lin | 148/188 X |
| 3,972,756 | 8/1976 | Nagase et al. | 148/187 X |
| 3,986,903 | 10/1976 | Watrous | 148/187 |

*Primary Examiner*—G. Ozaki
*Attorney, Agent, or Firm*—Staas & Halsey

[57] ABSTRACT

Disclosed is a process for producing a semiconductor device, especially, a high speed silicon gate field effect semiconductor device, by diffusing an impurity substance, such as arsenic or phosphorus, into a polycrystalline silicon layer to be converted into a silicon gate having a high electroconductivity and into portions of a single crystal silicon substrate to be converted into source and drain regions, in a sealed capsule, at an elevated temperature, under a vacuum. During the above-mentioned diffusing operation, the impurity substance can diffuse into the polycrystalline silicon layer at a higher diffusing speed than into the single crystal silicon substrate.

26 Claims, 8 Drawing Figures

PROCESS FOR PRODUCING A SEMICONDUCTOR DEVICE

BACKGROUND OF THE INVENTION

1. Field of the Invention

The present invention relates to a process for producing a semiconductor device. More particularly, the present invention relates to a process for producing a silicon gate field effect semiconductor device.

2. Description of the Prior Art

A conventional silicon gate field effect semiconductor device is provided with a gate electrode, a source region, a drain region and an insulating layer for insulating the gate electrode from the source and drain regions. The gate electrode is prepared by forming a polycrystalline silicon layer on a gate insulating layer and by diffusing an impurity substance, such as arsenic or phosphorus, into the polycrystalline silicon layer to convert it into an electroconductive layer having a very small resistivity. Also, the source and drain regions are prepared in a single crystal silicon layer on which the insulating layer and the gate electrode are supported, by diffusing the impurity substance into portions of the single crystal silicon substrate in accordance with a predetermined pattern.

In the conventional semiconductor device which works at a low speed, the source and drain regions have a relatively large depth, for example, 9000 to 30000Å, respectively. When the above-mentioned low speed type of semiconductor device is prepared, in accordance with a conventional process, a material which is capable of generating therefrom the impurity substance to be diffused is applied onto the surfaces of the polycrystalline silicon layer and the single crystal silicon substrate in accordance with the predetermined pattern. Then, the impurity substance-generating material layer is heated in an oxygen-containing atmosphere at an elevated temperature of, for example from 900° to 1100° C., so as to allow the resultant impurity substance to diffuse into both the polycrystalline silicon layer and the single crystal silicon substrate. In this solid-to-solid type of diffusing operation, it is known that the diffusion speed of the impurity substance in the single crystal silicon substrate is larger than that in the polycrystalline silicon layer. However, in the preparation of the low speed type of semiconductor device, since the depth of the source and drain regions is large, when the diffusing operation is carried out over such a period of time that the impurity substance can thoroughly diffuse into the single crystal silicon substrate up to a large depth thereof, so as to provide source and drain regions each having a large depth, the impurity substance also can thoroughly diffuse into the polycrystalline silicon layer, so as to completely convert it into the electroconductive gate electrode.

However, recently, there has developed a requirement to provide a new type of semiconductor device which has a relatively small size and which works at a relatively high speed. In this type of the semiconductor device, the source and drain regions are required to have a relatively small depth, for example, 1500 to 4500Å, respectively. If the above-mentioned conventional method is applied to produce the new type of the semiconductor device, the diffusion operation should be limited to a relatively short time, so as to cause the resultant source and drain regions to have a relatively small depth, respectively. However, under this condition, the impurity substance can not thoroughly diffuse into the polycrystalline silicon layer. Therefore, the resultant silicon gate electrode has a poor electroconductivity, and is useless. The disadvantages of the conventional process will be explained again in more detail hereinafter.

In another conventional process, the impurity substance is diffused into both the polycrystalline silicon layer and the single crystal silicon substrate in accordance with an ion implantation method. In this method, the impurity substance is dosed in the same amount to the polycrystalline silicon layer as that to the single crystal silicon substrate. In the case of the high speed type semiconductor device, the source and drain regions have a small depth, respectively. The amount of the impurity substance sufficient for providing the source and drain regions is small. Accordingly, the amount of the impurity substance dosed to the polycrystalline silicon layer, which is the same as that dosed to the single crystal silicon substrate, is also small and, therefore, is insufficient for converting the polycrystalline silicon layer to the electroconductive gate electrode.

In order to increase the electroconductivity (and decrease the resistivity) of the polycrystalline silicon layer incompletely diffused by the impurity substance, it is necessary to apply an additional diffusing operation of the impurity substance into the incompletely diffused polycrystalline silicon layer. This necessity causes the process to be complicated and expensive. Otherwise, the diffusing operation of the impurity substance to the polycrystalline silicon layer is carried out separately from that to the single crystal silicon substrate. In this case, an insulating layer including a gate insulating portion and a field insulating portion, is formed on a substrate of single crystal silicon, and then a polycrystalline silicon layer is formed on the gate insulating portion. A first diffusing operation of the impurity substance is applied to the polycrystalline silicon layer. During this operation, a sufficient amount of the impurity substance for obtaining an electroconductive gate electrode diffuses into the polycrystalline silicon layer, whereas no impurity substance can diffuse into the single crystal silicon layer due to the barrier composed of the insulating layer. In accordance with a predetermined pattern, the field insulating portion is etched to open windows on the single crystal silicon substrate. A second diffusing operation of the impurity substance is applied to the opened portions of the single crystal silicon substrate for forming the source and drain regions therein. The above-mentioned process is effective for obtaining the electroconductive gate electrode, and the source and drain regions each having a desired quality. However, this process is complicated and expensive.

SUMMARY OF THE INVENTION

The object of the present invention is to provide a process for producing a semiconductor device, in which a necessary amount of an impurity substance can thoroughly diffuse into each of a polycrystalline silicon layer to be converted into a gate electrode and portions of a single crystal silicon substrate to be converted into source and drain regions, by a single diffusing operation.

The above-mentioned object can be attained by the process of the present invention which comprises the steps of:

providing a wafer having a single crystal silicon substrate, an insulating layer placed on a portion of the surface of said single crystal silicon substrate, and a polycrystalline silicon layer placed on the insulating layer, the surface of the polycrystalline silicon layer and at least two portions of the single crystal silicon substrate surface being exposed to the ambient atmosphere;

subjecting said wafer to a diffusing operation in which said wafer is placed together with a material capable of releasing therefrom an impurity substance comprising arsenic or phosphorus, in a sealed capsule, the capsule is evacuated and heated at an elevated temperature, which causes the impurity substance to be released from the material and the released impurity substance to diffuse into both the single crystal silicon substrate and the polycrystalline silicon layer; and optionally, connecting the resultant silicon gate, source and drain regions, respectively, with electrodes.

DETAILED DESCRIPTION OF THE PREFERRED EMBODIMENTS

Generally, according to the present invention, an n-channel type silicon gate field effect semiconductor device is produced by the following procedures.

Figure 1A:
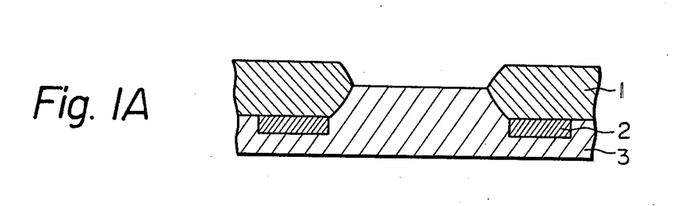
FIGS. 1A to 1D respectively illustrate steps of the process of the present invention for producing an n-channel type MIS semiconductor device.
Figure 1B:
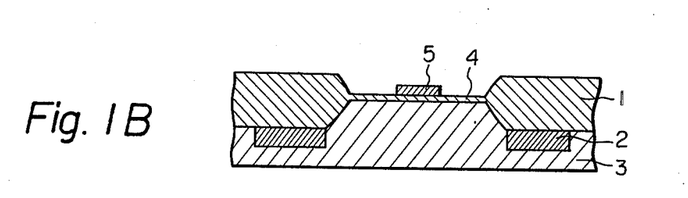

Referring to FIG. 1A, insulating layers 1 comprising silicon dioxide and channel stoppers 2 comprising boron diffused layers are provided on a base layer 3 comprising single crystal silicon in accordance with a predetermined pattern. The single crystal silicon substrate 3 may be, for example, of the p type, and may have plane index of (100) and a specific resistivity of 1 ohm-cm. Referring to FIG. 1B, a surface layer of the single crystal silicon substrate is filled-oxidized to form an insulating layer 4 comprising silicon dioxide. Thereafter, in accordance with a predetermined pattern, a polycrystalline silicon layer 5 is formed on the insulating layer 4. By using the polycrystalline silicon layer 5 as a mask, the portions of the insulating layer 4 exposed to the ambient atmosphere are removed by way of etching.

Figure 1C:
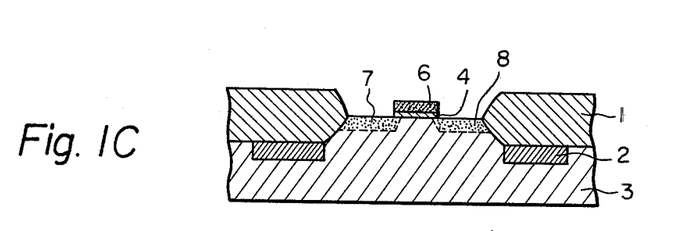

The resulting device is subjected to an operation for diffusing an impurity substance such as arsenic or phosphorus into both the polycrystalline silicon layer 5 and the portions of the single crystal silicon substrate 3 exposed to the ambient atmosphere. Referring to FIG. 1C, as a result of the above-mentioned diffusing operation, the polycrystalline silicon layer 5 is converted into an electroconductive gate electrode 6, and a source region 7 and a drain region 8 are formed in the single crystal silicon substrate 3.

Figure 1D:
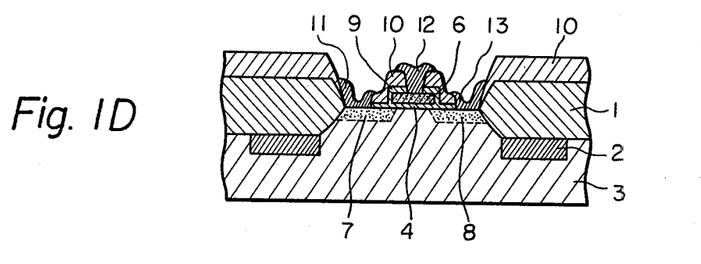

Referring to FIG. 1D, an insulating layer 9, comprising silicon dioxide, is formed around the gate electrode 6 and the upper surface of the device is covered with an insulating layer 10 comprising PSG (phosphosilicate glass). Thereafter, portions of the insulating layer 10 and portions of the insulating layer 9 are removed to form windows in accordance with a predetermined pattern. Aluminum electrodes 11, 12 and 13 are formed in the above-formed windows. The electrode 11 is connected to the source region 7, the electrode 12 to the gate electrode 6 and the electrode 13 to the drain region 8.

In order to compare the diffusing speed of the impurity substance into the polycrystalline silicon layer with that into the single crystal silicon substrate under an ambient atmospheric pressure, the following experiment was carried out. In this experiment, a polycrystalline silicon layer having a thickness of 2000Å was formed on an insulating layer by a conventional chemical vapor deposition method at a temperature between 600° and 700° C. Thereafter, portions of the insulating layer to be converted into source and drain regions were removed by a conventional etching method. The device was placed in a nitrogen gas atmosphere, containing arsine ($AsH_3$), monosilane ($SiH_4$) and oxygen, at a temperature of 550° C., so as to form a covering layer comprising an arseno-silicate glass ($As_2O_3$-$SiO_2$) and having a thickness of 3000Å on the above -prepared device surface. The molar ratio of arsine ($AsH_3$) to monosilane ($SiH_4$) in the nitrogen gas was 0.4. The device was subjected to a diffusing operation of the impurity substance, that is, the elementary arsenic, from the covering arseno-silicate glass layer into the polycrystalline silicon layer and the single crystal silicon substrate. The diffusing operation was carried out at a temperature of 950° C., for 50 minutes, in an oxygen-containing atmosphere. After the diffusing operation was completed, the remaining arseno-silicate glass layer was removed from the device. The surface resistivities of the arsenic-diffused polycrystalline silicon layer and single crystal silicon substrate were measured. Thereafter, the device was heat-treated at a temperature of 1100° C. in a nitrogen gas atmosphere to additionally diffuse the arsenic into the above-mentioned layers. The surface resistivity of each layer was measured at stages of 10, 20, 40 and 80 minutes after the start of the heat-treatment.

Figure 2:
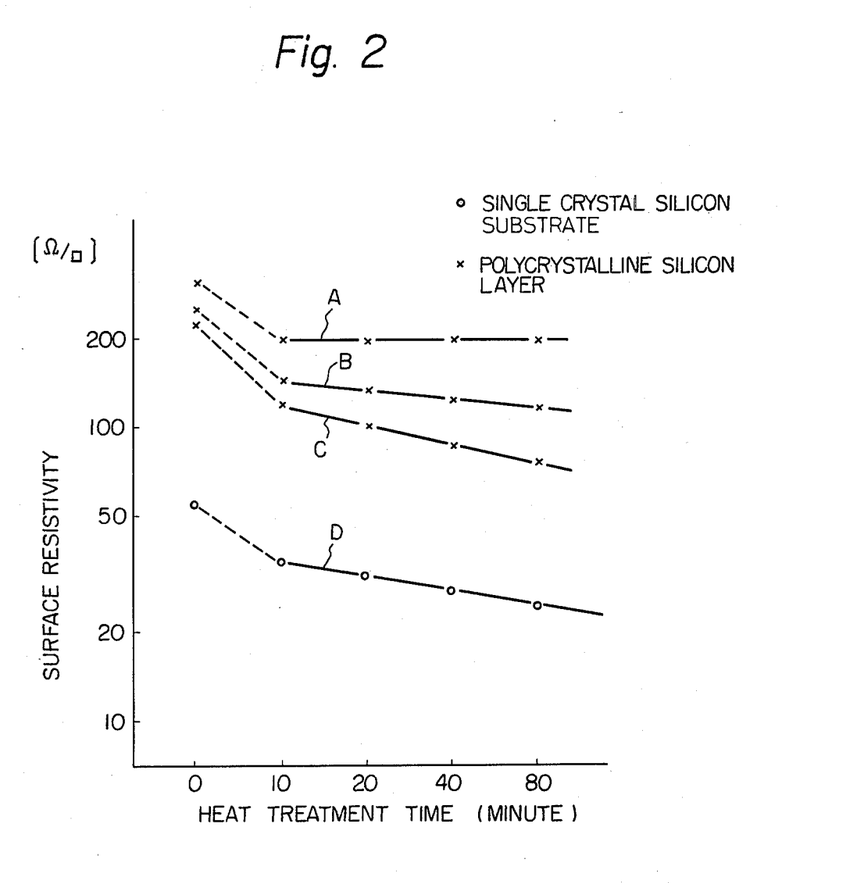
FIG. 2 is a graph showing the relationship between surface resistivities of polycrystalline silicon layers and a single crystal silicon substrate, each diffused by an impurity in accordance with a conventional process, and heat-treating time for the above-mentioned substrate and layers.

The surface resistivities of the polycrystalline silicon layer having a thickness of 2000Å and diffused by the arsenic are shown by Curve A in FIG. 2, and the surface resistivities of the single crystal silicon substrate are shown by Curve D in FIG. 2.

The same procedures as those mentioned above were carried out twice more, except that the polycrystalline silicon layer was formed so as to have a thickness of 4000Å and 8000Å. The surface resistivities of the polycrystalline silicon layers having thicknesses of 4000Å and 8000Å are shown by Curve B and Curve C in FIG. 2, respectively.

Referring to FIG. 2, it is clear that at the completion of each of the diffusing operations, and at 10, 20, 40 and 80 minutes after the start of the heat-treating operation, the polycrystalline silicon layer had a remarkably higher surface resistivity than that of the single crystal silicon substrate. That is, under the above-mentioned conventional diffusing conditions, the impurity substance, arsenic, could diffuse at a high speed into the single crystal silicon substrate, whereas the polycrystalline silicon layer permitted the impurity substance to diffuse thereinto at a low speed.

The above-mentioned experiments were carried out by using arsenic as the impurity substance. The same procedures as those mentioned above were repeated, except that phosphorus was used in place of arsenic. The results were substantially the same as those of arsenic.

As the results of the above-mentioned experiment clearly show, the diffusing speed of the impurity substance in the single crystal silicon substrate is remarkably higher than that in the polycrystalline silicon layer. Therefore, in the preparation of a high speed MIS semiconductor device which needs to be provided with shallow source and drain regions, it is impossible to simultaneously form the gate electrode, and the source and drain regions by way of self-alignment in one diffusing operation.

However, in the process of the present invention, in spite of the fact that the diffusing speed of the impurity substance into the single crystal silicon substrate is significantly different from that into the polycrystalline silicon layer, all of the gate electrodes, and the source and drain regions, each having a desired satisfactory quality, can be produced in one single diffusing operation.

The essential feature of the process of the present invention is created on the basis of such a discovery of the inventors of the present invention that the impurity substance can diffuse into the polycrystalline silicon layer at a higher diffusing speed than that into the single crystal silicon substrate under a vacuum condition in a capsule.

Figure 3:
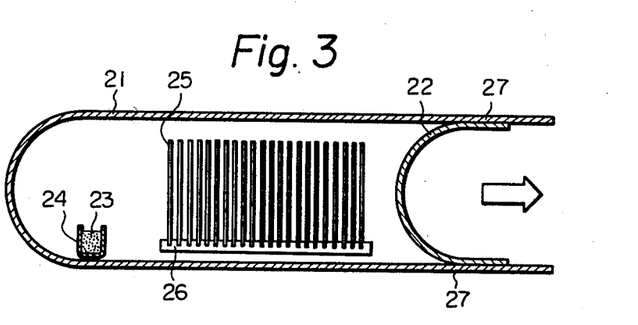
FIG. 3 is an explanatory cross-sectional view of an embodiment of the device for carrying out the process of the present invention.

The diffusing operation in the process of the present invention can be carried out, for example, by using the device as shown in FIG. 3. In FIG. 3, a quartz capsule 21 can be sealed gas-tight by a quartz sealing plug 22. Before the sealing operation, a source of an impurity substance 23, such as arsenic or phosphorus, is placed in a quartz vessel 24, and the vessel 24 is placed in the capsule 21. The source of the impurity substance may be elementary arsenic or phosphorus, or arsenic-or phosphorus-containing silicon.

A number of wafers 25 are stood on a wafer holder 25 and the holder 26 is placed in the capsule 21. The air present in the inside space of the capsule 21 is removed so that the pressure of the inside space becomes $2 \times 10^{-5}$ torr or less at a temperature of 300° to 600° C. The sealing portion 27 of the capsule 21 is heated with an oxygen-hydrogen flame and, then, the capsule 21 is sealed gas-tight by the sealing plug 22. It is preferable that the pressure of the inside space of the sealed capsule be $5 \times 10^{-6}$ torr or less.

The sealed capsule is placed in a heating oven and heated to a temperature of from 850° to 1150° C., more preferably, from 900° to 1000° C, for a period of time of, for example, from 20 to 120 minutes. During the above-mentioned heating operation, an impurity substance is released from the material 23 in the quartz vessel 24, and diffused into both the polycrystalline silicon layer and the single crystal silicon substrate. After the completion of the above-mentioned diffusing operation, the wafers are removed from the capsule. The wafers thus treated may be additionally heat-treated at a temperature of, for example, from 1100° to 1200° C., in an oxygen or nitrogen gas atmosphere under an atmospheric pressure.

Figure 4:
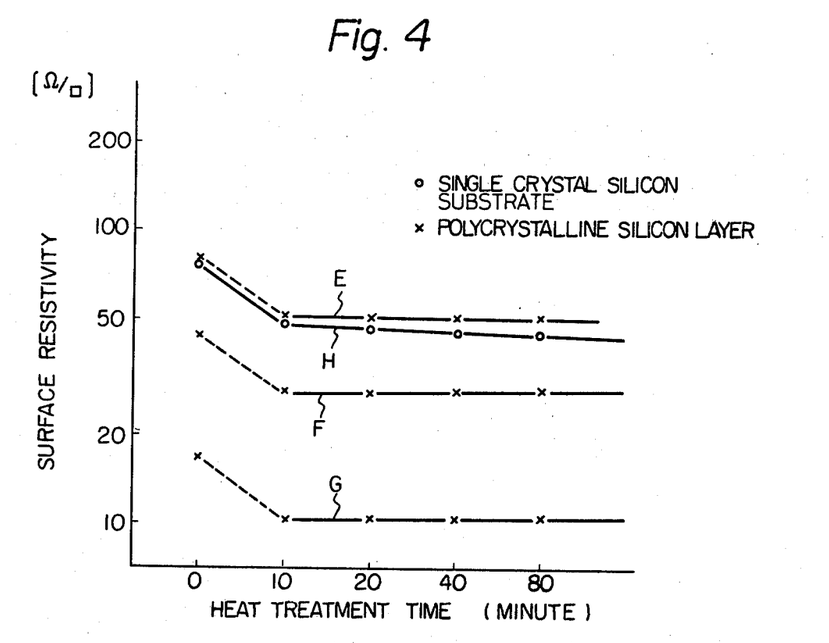
FIG. 4 is a graph showing the relationship between surface resistivities of polycrystalline silicon layers and a single crystal silicon substrate, each diffused by an impurity substance in accordance with the process of the present invention, and heat-treating time for the above-mentioned layers and substrate.

In order to illustrate the advantages of the process of the present invention, a wafer as shown in FIG. 1C was prepared. In this wafer, the polycrystalline silicon layer had a thickness of 2000Å. The diffusing operation was carried out by using an arsenic-containing silicon as a source of the impurity substance, at a temperature of 950° C., for 50 minutes, under an arsenic vapor pressure of 40 torr. After the completion of the diffusing operation, the device was subjected to a measurement of the surface resistivities of the arsenic-diffused polycrystalline silicon layer and single crystal silicon substrate. The device was heat-treated at a temperature of 1100° C. At each stage of 10, 20, 40 and 80 minutes after the start of the heat-treatment, the device was subjected to the measurement of the surface resistivities of the arsenic-diffused polycrystalline silicon layer and single crystal silicon substrate. In FIG. 4, the surface resistivities of the arsenic-diffused polycrystalline silicon layer having a thickness of 2000Å are shown in Curve E and those of the arsenic-diffused single crystal silicon substrate in Curve H.

Procedures identical to those mentioned above were repeated twice, except that the thickness of the polycrystalline silicon layer was 4000Å (Curve F) and 8000Å (Curve G).

If FIG. 2 is compared with FIG. 4, it is clear that in the diffusing operation in vacuum in accordance with the present invention, the diffusing speed of the impurity substance into the polycrystalline silicon layer having a thickness of 4000Å or 8000Å is higher than that into the single crystal silicon substrate; whereas in the conventional process, the diffusing speed of the impurity into the polycrystalline silicon layer is remarkably lower than that into the single crystal silicon substrate. In FIG. 4, when the thickness of the polycrystalline silicon layer is 2000Å, the diffusing speed of the impurity substance thereinto appears to be a little lower than that into the single crystal silicon substrate. However, this phenomenon is mainly due to decrease in mobility of electrons in the very thin polycrystalline silicon layer and not to the low diffusing speed of the impurity substance thereinto. The smaller the thickness of the electroconductive layer, the lower the mobility of electrons in the layer, and, therefore, the higher the surface resistivity of the layer.

If the diffusing operation of the impurity substance is carried out in an atmosphere containing oxygen, the surface portion of the polycrystalline silicon layer is oxidized so as to cause the surface of the layer to be covered with a silicon oxide film. That is, the diffusion of the impurity substance through boundaries between the silicon crystal grains is obstructed by the silicon oxide film. However, in the process of the present invention, the diffusing operation is carried out in an atmosphere containing substantially no oxygen. Therefore, during the diffusing operation, no silicon oxide film is formed on the surface of the polycrystalline silicon layer, and the grain boundary diffusion of the impurity substance can easily be effected.

Referring to FIG. 2, it is clear that when the conventional diffusing method is used, the heat treatment after the diffusing operation is effective for decreasing the surface resistivities of not only the polycrystalline silicon layer but also the single crystal silicon substrate. However, in view of FIG. 4, it is evident that in the process of the present invention, the heat-treatment for more than 10 minutes exhibits no effect for decreasing the surface resistivities of the arsenic-diffused polycrystalline silicon layer and single crystal silicon substrate.

Figure 5:
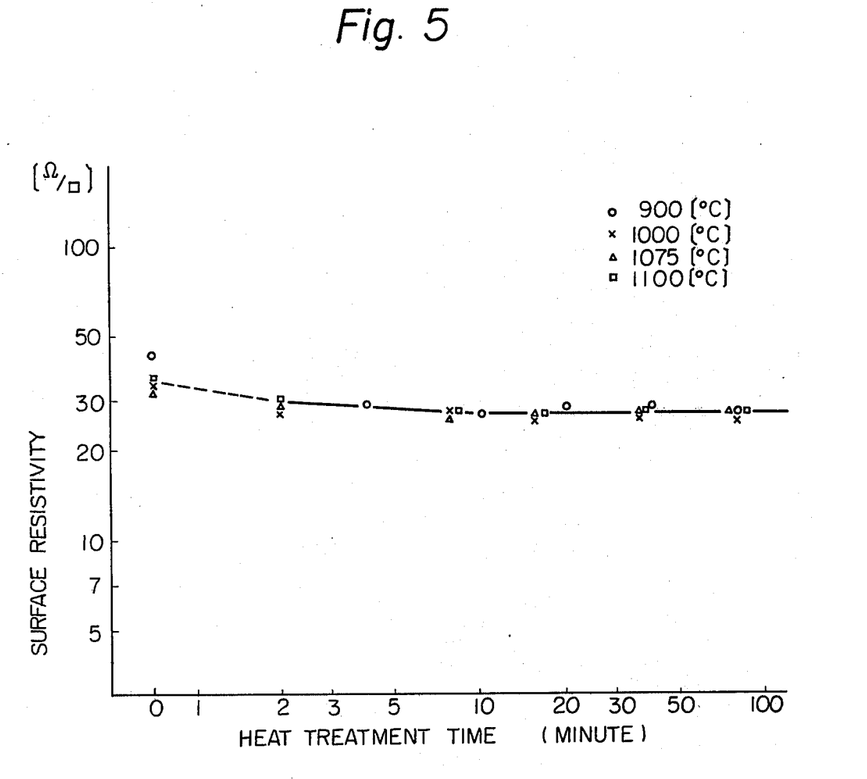
FIG. 5 is a graph showing the relationship between surface resistivities of polycrystalline silicon layers, into which an impurity substance has been diffused at various temperatures in accordance with the process of the present invention, and heat-treating time for the above-mentioned layers.

In order to illustrate in more detail the effect of the heat-treatment for the device produced in accordance with the process of the present invention, the following experiment was carried out. In accordance with the process of the present invention a device as shown in FIG. 1C was prepared. The polycrystalline silicon layer was produced at a temperature of 620° C. by the aforementioned chemical vapor deposition method. The resultant layer had a thickness of 4000Å. The device was placed in a capsule as shown in FIG. 3. An arsenic-containing silicon as a source of the impurity substance was also placed in the capsule. The diffusing operation was carried out at a temperature of 950° C., for 50 minutes, under arsenic vapor pressure of about 40 torr. The above-mentioned procedures were repeated four times to provide four pieces of the devices. The devices were respectively heat-treated at a different temperature selected from 900°, 1000°, 1075° and 1100° C. The surface resistivity of each device was determined just after the completion of the diffusing operation and at several stages during the heat-treatment. The results are shown in FIG. 5. From FIG. 5, it is obvious that the diffusion of the impurity substance was saturated about 2 minutes after the start of the heat-treatment at all of the temperatures of 900°, 1000°, 1075° and 1100° C. That is, a heat-treatment temperature higher than 900° C. has no effect in decreasing the surface resistivity of the arsenic-diffused polycrystal silicon layer to a value less than that obtained by the heat-treatment at the temperature of 900° C. Furthermore, it was observed that during the heat-treatment, the impurity substance diffused over a depth of 300Å into the single crystal silicon substrate at the diffusing temperature of 900° C., a depth of 700Å at the diffusing temperature of 1000° C. and a depth of 1400Å at the diffusing temperature of 1075° C.

From the above-mentioned experiment, it can be understood that, in accordance with the process of the present invention, the polycrystalline silicon layer can be thoroughly saturated with an amount of the impurity substance totally sufficient for obtaining a practical and useful electroconductive gate electrode, under such a condition that the impurity substance can simultaneously diffuse into the single crystal silicon substrate to an extent that the resultant source and drain regions have a quality satisfactory for practical use.

For example, a short channel type silicon gate MIS semiconductor device was produced in accordance with the process of the present invention. The polycrystalline silicon layer to be converted into the silicon gate electrode had a thickness of 4000Å and the diffusing operation of an impurity of elementary arsenic was carried out in a vacuum capsule at a temperature of 950° C., under arsenic vapor pressure of about 40 torr, for 50 minutes. Thereafter, the resultant device was heat-treated at a temperature of 1100° C. for about 10 to 20 minutes. The resultant silicon gate electrode had a surface resistivity of 28 ohm/cm², and the resultant source and drain regions had a depth of 3000Å and a surface resistivity of 65 ohm/cm².

When the same procedures as those mentioned above were carried out, except that the thickness of the polycrystalline silicon layer was 8000Å, the surface resistivity of the resultant silicon gate electrode was about 10 ohm/cm². Accordingly, it is understood that, in the case where the diffusing operation is carried out under such a condition that the resultant source and drain regions have a depth of from 1500 to 3000Å and a surface resistivity of from 60 to 100 ohm/cm², the polycrystalline silicon layer can be thoroughly saturated by the impurity substance in a sufficient amount for obtaining a resultant silicon gate electrode having a sufficiently low and constant value of surface resistivity.

With respect to the device obtained in the above-mentioned experiment, the distribution of the arsenic atoms in the silicon gate electrode, and the source and drain regions, was observed by a back-scattering analysis. It was confirmed that the arsenic atoms are distributed at a uniform density of $8 \times 10^{20}$ atoms/cm³ in the silicon gate electrode and at a uniform density of the order of $3 \times 10^{20}$ atoms/cm³ in the source and drain regions.

In order to obtain the above-mentioned level of distribution of the arsenic atoms by the conventional ion implantation method, the arsenic should be implanted in an amount of $2 \times 10^5$ dosed atoms/cm² into the single crystal silicon substrate to be converted into the source and drain regions; in an amount of $1 \times 10^{16}$ atoms/cm² into the polycrystalline silicon layer 4000Å thick, and; in an amount of $2 \times 10^{16}$ atoms/cm² into the polycrystalline silicon layer 8000Å thick.

The process of the present invention can be effected by using phosphorus as the impurity substance in place of arsenic. For example, the diffusing operation in accordance with the process of the present invention was applied to a polycrystalline silicon layer having a thickness of 4000Å and formed on an insulating layer, and to a single crystal silicon substrate of p type, and having a plane index of (111) and a specific gravity of 1 ohm cm. The diffusing operation was carried out by using a phosphorus-containing silicon as a source of the impurity substance, at a temperature of 950° C., for 40 minutes, under phosphorus vapor pressure of about 60 torr. For comparison, the conventional diffusing operation was applied to the same layers as mentioned above. Before this comparison diffusion operation, a phospho-silicate glass film having a thickness of 3000Å was formed on the layers by a conventional chemical vapor deposit method. The diffusing operation was carried out at a temperature of 950° C., 40 minutes, in an air atmosphere. The surface resistivity of each of the resultant silicon gate electrodes, and source and drain regions were measured. The results are shown in the following table.

Table

|  | Surface resistivity (ohm/cm²) | |
| --- | --- | --- |
|  | The present invention | Comparison method |
| Source and drain regions | 28 | 25 |
| Silicon gate electrode | 16 | 80 |

The diffusing operation in the process of the present invention is most effective for diffusing the impurity substance having a relatively high vapor pressure. Another impurity substance, such as antimony or boron, which has a relatively low vapor pressure is not suitable for the process of the present invention, because the diffusing operation will cause the wafer to be thermally etched.

As the above description clearly illustrates, in accordance with the process of the present invention, it is possible to diffuse the impurity substance, such as arsenic or phosphorus, into the polycrystalline silicon layer at a higher diffusing speed than that into the single crystal silicon substrate. Accordingly, it is also possible to convert the polycrystalline silicon layer into a silicon gate, having a high electroconductivity satisfactory for using the gate as an electrode or conducting member, by a single diffusing operation which is sufficient for creating shallow source and drain regions. Accordingly, the process of the present invention is very useful for producing a high speed short channel type silicon gate MIS semiconductor device by a single diffusing operation during which the conversion of the polycrystalline silicon layer into an electroconductive silicon gate electrode can be effected simultaneously with the formation of the source and drain regions in the single crystal silicon substrate.

What we claim is:

1. A process for producing a semiconductor device, comprising the steps of:
   providing a wafer comprising a single crystal silicon substrate, an insulating layer selectively covering said substrate, and a polycrystalline silicon layer selectively covering said insulating layer and substrate to leave at least two portions of said single crystal silicon substrate exposed;
   subjecting said wafer to a diffusing operation in which said wafer is placed in a capsule together with a material capable of releasing an impurity substance, in which the capsule is evacuated and heated to a temperature sufficient to cause the impurity substance to be released from said material and to simultaneously diffuse into both the exposed portions of the substrate and the polycrystalline silicon layer in amount sufficient to form at least one pair of source and drain regions in said substrate and at least one gate in said polycrystalline silicon for device; and
   selectively electrically connecting said at least one gate and source and drain regions within said device.

2. A process as claimed in claim 1, wherein said insulating layer comprises silicon dioxide.

3. A process as claimed in claim 1, wherein said capsule is evacuated by reducing the pressure of said capsule to $5 \times 10^{-6}$ torr or less prior to said heating for said diffusion.

4. A process as claimed in claim 3, wherein said evacuation is carried out at a temperature of from 500° to 600° C.

5. A process as claimed in claim 1, wherein said heating for said diffusing is carried out at a temperature of from 850° to 1150° C.

6. The process of claim 5, said heating for said diffusion being carried out at a temperature of from 900° to 1000° C.

7. The process of claim 5, said heating operation comprising holding said capsule at said elevated temperature for a period between 20 and 120 minutes.

8. A process as claimed in claim 1, wherein, after the completion of said diffusing, said wafer is removed from said capsule and heat-treated at a temperature of from 1100° to 1200° C.

9. The process of claim 8, said heat treatment occurring in an atmosphere comprising one gas chosen from the group consisting of oxygen and nitrogen at atmospheric pressure.

10. The process of claim 1 wherein, after the completion of said diffusing operation, said wafer is removed from said capsule and heat-treated at a temperature of at least approximately 900° C.

11. The process of claim 1, said impurity comprising an impurity selected from the group consisting of arsenic and phosphorus.

12. The process of claim 1, wherein said evacuating of said capsule reduces the pressure of said capsule to $2 \times 10^{-5}$ torr or less while the temperature of said capsule is raised to between 300° and 600° C.

13. The process of claim 8 or 10, said heat treatment lasting for a period of at least two minutes.

14. The process of claim 1, said impurity comprising a high vapor pressure at said elevated temperature.

15. A process for producing a high speed semiconductor device comprising:
   forming a single crystal silicon substrate selectively covered by an insulating layer with at least one window in said insulating layer, and a layer of polycrystalline silicon selectively formed after said insulating layer to leave said substrate selectively exposed through at least one portion of said window(s),
   subjecting said wafer to a diffusion operation comprising sealing said wafer and a solid source of dopant having a sufficiently high vapor pressure separately in a capsule, evacuating said capsule at at least an intermediate elevated temperature and subsequently heating said capsule to a higher temperature to cause said dopant to move from said solid source as a gas and to diffuse into said polycrystalline silicon and the exposed portions of said substrate in sufficient amount for forming at least one gate electrode from said polycrystalline silicon and at least one shallow selected source and drain region of depth less than 9000Å in said exposed substrate.

16. The process of claim 15 comprising heating said capsule for said diffusion to a temperature in the range from 850° to 1150° C. for a period from 20 to 120 minutes.

17. The process of claim 16, each said shallow source and drain region having a depth of less than 4500Å.

18. The process of claim 17, said polycrystalline silicon layer having a thickness of up to approximately 8000Å.

19. The process of claim 18 comprising subsequently heat treating said substrate for less than 10 minutes at a temperature as low as 900° C.

20. The process of claim 19 comprising providing said gate electrode with a surface resistivity as low as 10 ohm/cm$^2$ and said source and drain regions with a surface resistivity as low as 60 ohm/cm$^2$.

21. The process of claim 19 comprising performing said heat treatment in 2 minutes or less.

22. The process of claim 19 comprising performing said heat treatment in an atmosphere of a gas selected from the group of oxygen and nitrogen at a pressure of up to approximately one atmosphere.

23. The process of claims 15, 16, 18, 19 or 20 comprising forming said shallow regions to have a depth as low as 300Å.

24. The process of claim 15 comprising heating said capsule for said diffusion to a temperature in the range from 900° to 1000° C.

25. The process of claims 15, 16, 24, 19 or 20 comprising selecting said dopant from the group consisting of arsenic and phosphorus.

26. The process of claim 15 comprising forming one pair of said shallow regions for each one of said gates, each said shallow region of each said pair being disposed on a respective side of said gate, said process involving self-alignment of each said pair of shallow regions with said gate.

* * * * *

UNITED STATES PATENT AND TRADEMARK OFFICE
CERTIFICATE OF CORRECTION

PATENT NO. : 4,210,473

DATED : July 1, 1980

INVENTOR(S) : Mikio Takagi et al.

It is certified that error appears in the above—identified patent and that said Letters Patent is hereby corrected as shown below:

Column 1, line 39, after "example" insert --,--;
line 40, "C.," should be --C,--.
Column 2, line 1, "can not" should be --cannot--;
line 35, after "layer" insert --,--.
Column 3, line 56, after "have" insert --a--.
Column 4, lines 33, 43, and 50, "C." should be --C--;
line 35, "above -prepared" should be --above-prepared--.
Column 5, line 62, "C.," should be --C,--.
Column 6, lines 4 and 12, "C.," should be --C,--.
Column 7, lines 13, 19, 32, 39, 40, 59, and 61, "C." should be --C--.
Column 8, line 26, "4000A" should be "4000Å";
"thick, and;" should be --thick; and--;
line 28, "8000A" should be --8000Å--;
line 36, "ohm cm." should be --ohm-cm.--;
line 47, before "40" insert --for--.
Column 9, line 40, after "for" insert --said--.
Column 10, line 42, "C." should be --C--.

Signed and Sealed this

Third Day of March 1981

[SEAL]

Attest:

RENE D. TEGTMEYER

Attesting Officer     Acting Commissioner of Patents and Trademarks